United States Patent
Nguyen et al.

(10) Patent No.: US 8,803,608 B2
(45) Date of Patent: Aug. 12, 2014

(54) APPARATUS FOR AMPLIFYING AN INPUT-SIGNAL

(71) Applicant: Fraunhofer-Gesellschaft zur Foerderung der angewandt Forschung e.V., Munich (DE)

(72) Inventors: Hung-Anh Nguyen, Berlin (DE); Wilhelm Keusgen, Berlin (DE); Andreas Kortke, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/022,644

(22) Filed: Sep. 10, 2013

(65) Prior Publication Data

US 2014/0009231 A1    Jan. 9, 2014

Related U.S. Application Data

(63) Continuation of application No. PCT/EP2012/053816, filed on Mar. 6, 2012.

(30) Foreign Application Priority Data

Mar. 11, 2011 (EP) .................................. 11157913

(51) Int. Cl.
*H03F 3/217* (2006.01)
*H03F 3/191* (2006.01)

(52) U.S. Cl.
CPC ............... *H03F 3/217* (2013.01); *H03F 3/191* (2013.01)
USPC ...................... 330/251; 330/207 A

(58) Field of Classification Search
USPC ........................ 330/251, 207 A, 10
See application file for complete search history.

(56) References Cited

U.S. PATENT DOCUMENTS

| | | | |
|---|---|---|---|
| 6,359,983 B1 * | 3/2002 | Krone et al. | 379/399.01 |
| 7,835,461 B2 | 11/2010 | May et al. | |
| 7,839,939 B2 * | 11/2010 | Lee et al. | 375/259 |
| 8,085,885 B2 * | 12/2011 | Li | 375/344 |
| 8,532,215 B2 * | 9/2013 | Huang et al. | 375/267 |
| 2009/0154598 A1 * | 6/2009 | Jensen | 375/308 |

FOREIGN PATENT DOCUMENTS

| | | |
|---|---|---|
| EP | 2 043 258 A1 | 4/2009 |
| WO | 2007/063387 A2 | 6/2007 |

OTHER PUBLICATIONS

Raab, "Radio Frequency Pulsewidth Modulation", IEEE Transactions on Communications, Aug. 1973, pp. 958-966.
Official Communication issued in International Patent Application No. PCT/EP2012/053816, mailed on May 8, 2012.

* cited by examiner

*Primary Examiner* — Henry Choe
(74) *Attorney, Agent, or Firm* — Keating & Bennett, LLP

(57) ABSTRACT

Embodiments of the present invention provide an apparatus for amplifying an input-signal. The apparatus includes a switch-mode amplifier for amplifying a digital input-signal. The apparatus is characterized by a generator for generating the digital input-signal based on the input-signal, wherein the generator is configured to generate the digital input-signal such that the digital input-signal is located at a predefined frequency band and such that distortions are located at a frequency higher than the predefined frequency band.

15 Claims, 11 Drawing Sheets

APPARATUS FOR AMPLIFYING AN INPUT-SIGNAL

CROSS-REFERENCE TO RELATED APPLICATIONS

This application is a continuation of copending International Application No. PCT/EP2012/053816, filed Mar. 6, 2012, which is incorporated herein by reference in its entirety, and additionally claims priority from European Application No. EP 11157913.2, filed Mar. 11, 2011, which is also incorporated herein by reference in its entirety.

BACKGROUND OF THE INVENTION

Embodiments of the present invention relate to an apparatus for amplifying an input-signal. Some embodiments relate to an apparatus for amplifying an input-signal, the apparatus comprising a switch-mode amplifier for amplifying a digital input-signal and a generator for generating the digital input-signal. Some embodiments relate to a vector modulating linear switch-mode amplifier.

In electronics and especially in wireless communication there are many applications where bandpass-signals have to be generated and amplified. A bandpass-signal is an electrical signal, whose spectral energy is limited to a certain bandwidth around a carrier frequency. The bandpass-signal has no DC component and no spectral components above a certain cut-off frequency. The bandwidth is typically several percent of the carrier frequency. In most applications, a bandpass-signal is generated by means of digital signal-processing, whereas the signals are represented as complex-valued digital baseband-signals. A complex-valued baseband-signal has two components. A real and an imaginary part, respectively an I- and a Q-component. The common procedure is, to convert the digital I- and Q-signals to real-valued analog low-pass-signals and to bring them into the bandpass-domain, using an IQ-Mixer or vector modulator, driven by a harmonic signal of carrier frequency. Therefore, the IQ-Mixer can be seen as a frequency converter and its operation as frequency conversion. In general, a bandpass-signal has a non-constant envelope, characterized by the peak-to-average power ratio. In many cases, the bandpass-signal has to be amplified by means of an amplifying device.

A power amplifier is a two port device which has a port for the input-signal and a port for the output-signal. It uses an auxiliary power source to produce an output-signal with increased power compared to the input-signal. An amplifier is realized by means of amplifying devices such as transistors or tubes. These amplifying elements are nonlinear in general. In most technical applications, e.g. in wireless communication, a nonlinear distortion of the output-signal has to be avoided, since it produces unwanted out-of-band emissions and in-band distortions. A nearly perfect linear behavior is accomplished by driving the amplifying element with small signal amplitudes, compared to the maximum amplitude allowed by the device. Increasing the input amplitude results in a more nonlinear behavior, where the highest signal values in the output-signal become slightly compressed. But the output-signal has still a varying magnitude and the amplifier is denoted to be weakly nonlinear. In contrast to that, a strongly nonlinear behavior results in a hard bounded amplitude of the output-signal which is constant and independent from the input magnitude. Such a signal has only two states, which correspond to the signum function of the input-signal, and will be referred to as a binary signal in the following.

Examples for amplifiers showing almost no or weak non-linearity are class A or class AB amplifiers, examples for strong nonlinear amplifiers are class D and class E amplifiers such as digital line drivers and pulse amplifiers. Those strong nonlinear amplifiers will be denoted as switch-mode amplifiers in the following, since the amplifier basically acts like a switched current source, which is triggered by the signum function of the input-signal.

The efficiency of an amplifier is defined as the ratio of the average power of the output-signal to the input power, where the input power is the average power delivered from the auxiliary power source added to the power of the driving input-signal. The efficiency of a weak nonlinear amplifier is comparatively low and decreases even more for signals with a high peak to average power ratio. In contrast to that, switch-mode amplifiers show an efficiency of up to 1, which is based on the fact, that ideally either the voltage across or the current through the switching element is zero at any time instant. Therefore, from the efficiency point of view, a switch-mode amplifier is highly desirable. On the downside a switch-mode amplifier removes any amplitude information from the input-signal by definition. Therefore, the amplitude of the input-signal has to be preserved by the additional application of a pulse modulation scheme at the input of the amplifier which results in a binary input-signal, with all information encoded in the zero crossings of the signal. At the output an additional demodulation of the amplified binary signal is needed to reconstruct the original signal. Moreover, the modulation produces unwanted out-of-band spectral components which have to be suppressed by the demodulation procedure. Otherwise the whole system—modulator, switch-mode amplifier, demodulator—would not behave like a linear power amplifier by definition.

To accomplish an undistorted i.e. linear amplification of the signal envelope, the amplifying device has to be operated with a certain headroom i.e. power back-off, which decreases the amplifier power-efficiency. Otherwise, the amplifying device may deform the bandpass-signal non-linearly, producing unwanted in-band distortions and unwanted out-of-band emissions. The poor power-efficiency of amplifiers for bandpass-signals, which may be as low as 10 percent for modern wireless communication signals causes a high demand for new amplifier concepts. Current approaches, which use adaptive digital amplifier predistortion show a massively increased hardware effort. Therefore there is also a wish for integrated solutions with reduced hardware complexity.

There are several solutions known to increase the power efficiency for bandpass-amplifiers. On circuit level, the Doherty topology provides better efficiency for high power back-off values. Envelope Elimination and Restoration and Bias Modulation are other techniques on system level to increase efficiency in the back-off operating region. Analogue feed-forward and feed-back circuits may be used to improve linearity for lower power-back-offs, which also increases the power efficiency. In contrast to this, closed-loop digital pre-distortion is implemented on system level and shows better linearity improvements for signals with comparatively large bandwidth. It is also capable to adapt to temporal changes in the amplifying device.

Whereas the mentioned solutions are designed for the improvement of amplifiers, which are linear in principle, the switch-mode techniques are intended to transform the bandpass-signal in a sequence of rectangular, binary pulses, which could be amplified with an theoretical efficiency of 100 percent. After amplification, the original bandpass-signal is reconstructed by low-pass filtering. From an engineering perspective, the transformation and reconstruction can be seen as a pulse modulation and demodulation problem. One well known switch-mode amplifier technique uses pulse width modulation (PWM), which is a feed-forward modulation scheme. Another well known switch-mode amplifier technique uses sigma delta modulation (SDM), which is a closed loop modulation scheme. Both schemes have the disadvantage that they produce inband signal distortions which can not be removed by the demodulator. These inband signal distortions can be reduced by increasing the switching frequency, by oversampling or by higher order loopback filtering (for SDM). This increases the demands on the amplifying device and therefore the cost of switch-mode amplifiers, especially for operation at high signal frequencies which are typical for radio frequency (RF) and microwave applications. Moreover, the closed loop architecture of the sigma delta modulation (SDM) concept tends to instability problems at very high operational frequencies because of feedback delay.

SUMMARY

According to an embodiment, an apparatus for amplifying an input-signal may have: a switch-mode amplifier for amplifying a binary input-signal; characterized by a generator for generating the binary input-signal based on the input-signal; wherein the generator includes a signal shaper configured to generate a binary continuous-time signal on the basis of the input-signal and a carrier signal, and to logically combine the binary continuous-time signal and a rectangular wave signal thereby generating the binary input-signal at a predefined frequency band, wherein distortions effected during generating the binary input-signal have a lowest frequency which is higher than the predefined frequency band.

According to another embodiment, a method for amplifying an input-signal may have the steps of: amplifying a binary input-signal with a switch-mode amplifier; characterized in that the binary input-signal is generated based on the input-signal; wherein generating the binary input-signal includes generating a binary continuous-time signal on the basis of the input-signal and a carrier signal, and to logically combine the binary continuous-time signal and a rectangular wave signal thereby generating the binary input-signal at a predefined frequency band, wherein distortions effected during generating the binary input-signal have a lowest frequency which is higher than the predefined frequency band.

Another embodiment may have a computer program having a program code for performing, when running on a computer or microprocessor, the inventive method.

Embodiments of the present invention provide an apparatus for amplifying an input-signal. The apparatus comprises a switch-mode amplifier for amplifying a digital input-signal. The apparatus is characterized by a generator for generating the digital input-signal based on the input-signal, wherein the generator is configured to generate the digital input-signal such that the digital input-signal is located at a predefined frequency band and such that distortions are located at a frequency higher than the predefined frequency band. In addition, the apparatus for amplifying an input-signal may comprise a low-pass filter for low-pass filtering the amplified digital input-signal, such that the distortions located at the frequency higher than the predefined frequency band are reduced or even eliminated.

In some embodiments of the present invention, the generator is configured for generating a digital input-signal for the switch-mode amplifier based on the input-signal, e.g. a real-valued baseband-, a complex-valued baseband-, a real-valued bandpass- or a complex-valued bandpass-signal. The generated digital input-signal is located at a predefined frequency band. Moreover, distortions e.g. effected during generating the digital input-signal for the switch-mode amplifier are located at a frequency higher than the predefined frequency band. Hence, the digital input-signal comprises no distortions within the predefined frequency band, or in other words, within the frequency spectrum of the desired digital input-signal to be amplified by the switch-mode amplifier. In addition, the switch-mode amplifier provides an amplification of the digital input-signal with a high power-efficiency. Moreover, since the distortions are not located within the predefined frequency band of the digital input-signal, a high linearity in amplification can be achieved by low-pass filtering the amplified version of the digital input-signal (output signal of the switched mode amplifier). Hence, the distortions located at a frequency higher than the predefined frequency band can be reduced or even eliminated without affecting the desired signal part.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
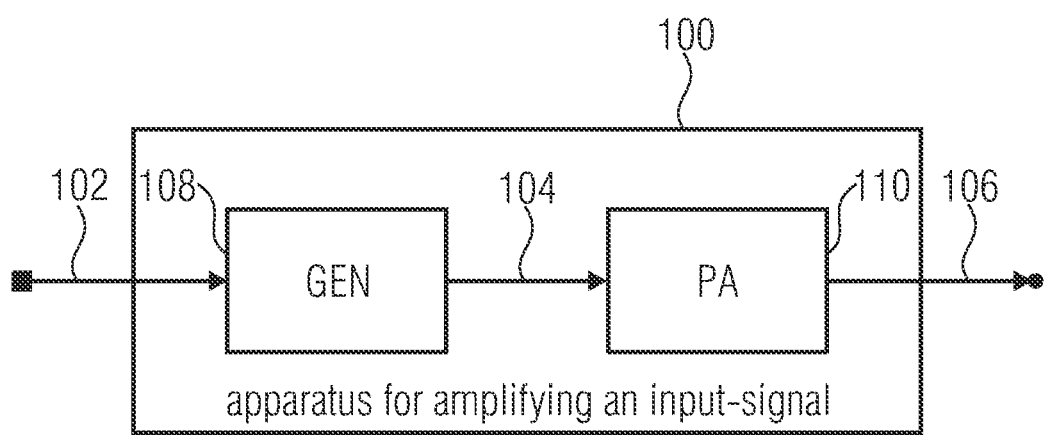
FIG. 1 shows a block diagram of an embodiment of an apparatus for amplifying an input-signal.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a block diagram of an embodiment of an apparatus 100 for amplifying an input-signal 102. The apparatus 100 comprises a switch-mode amplifier 110 and a generator 108. The generator 108 is configured for generating a digital input-signal 104 based on the input-signal 102. In addition, the generator 108 is configured to generate the digital input-signal 104 such that the digital input-signal 104 is located at a predefined frequency band and such that distortions are located at a frequency higher than the predefined frequency band. The switch-mode amplifier 110 is configured for amplifying the digital input-signal 104. The output-signal 106 of the switch-mode amplifier 110 might be an amplified digital input-signal or an amplified version of the digital input-signal 102.

According to the concept of the present invention, distortions of the digital input-signal, e.g. effected during generating the digital input-signal for the switch-mode amplifier, are located at a frequency higher than the predefined frequency band. Hence, the digital input-signal comprises no distortions within the predefined frequency band, or in other words, within the frequency spectrum of the desired digital input-signal 104 to be amplified by the switch-mode amplifier 110. In addition, the switch-mode amplifier 110 is able to amplify the digital input-signal 104 with a high power-efficiency.

In some embodiments, the apparatus 100 for amplifying an input-signal 102 may comprise a low-pass filter for low-pass filtering the amplified digital input-signal (output-signal of the switched-mode amplifier), such that the distortions located at the frequency higher than the predefined frequency band are reduced or even eliminated. Thereby, a high linearity in amplification of the input-signal 102 can be achieved and the distortions located at the frequency higher than the predefined frequency band can be reduced without affecting the desired signal spectrum part.

Furthermore, in some embodiments the generator 108 can be configured to shift the input-signal 102 from a baseband or a predefined intermediate frequency band to the predefined frequency band. The predefined intermediate frequency band might be a predefined bandwidth around an (centered) intermediate mixing frequency $f_m$. Additionally, the generator 108 can be configured to digitize the input-signal 102 to obtain the digital input-signal 104 for the switch-mode amplifier 110.

The input-signal 102 can be a baseband-signal or a bandpass-signal. Moreover, the input-signal 102 might be complex-valued or real-valued. In some embodiments the input-signal 102 might be a real-valued bandpass-input-signal (x(t)), where the digital-input-signal 104 might be a real-valued binary continuous-time signal (b(t)).

Figure 5:
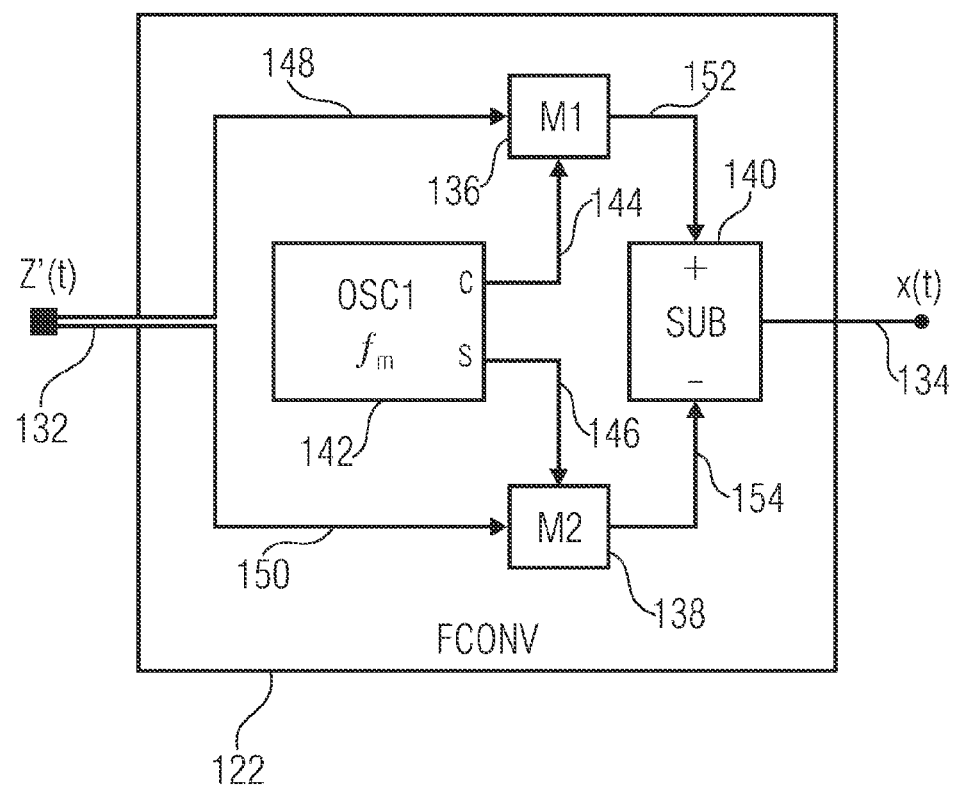
FIG. 5 shows a block diagram of an embodiment of the frequency converter shown in FIG. 3.

Moreover, in some embodiments, the generator 108 might be configured to convert a complex-valued input-signal (Z(t) or Z'(t)) into an (real-valued) input-signal (x(t)) located at the predefined intermediate frequency band e.g. as described in FIG. 5.

Figure 2:
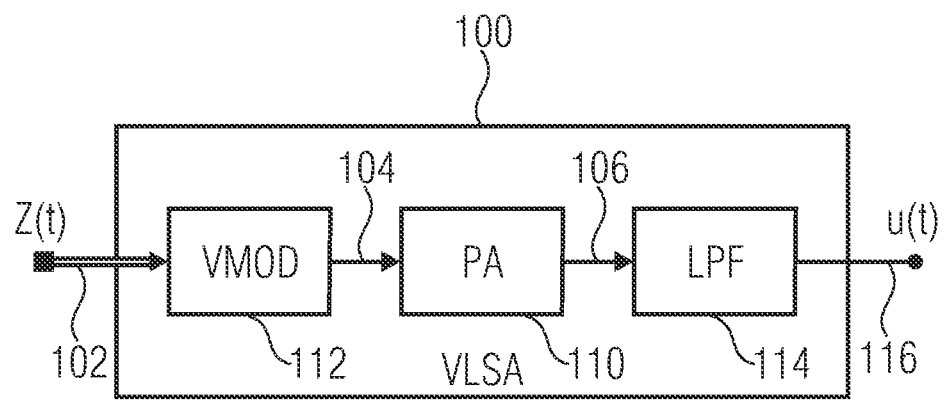
FIG. 2 shows a block diagram of an exemplary embodiment of an apparatus for amplifying an input-signal.

FIG. 2 shows a block diagram of an exemplary embodiment of an apparatus 100 for amplifying an input-signal 102. The apparatus 100 for amplifying an input-signal 102 shown in FIG. 2 is referred to as vector modulating linear switch-mode amplifier system (VLSA) and comprises a vector modulation sub-system (VMOD) 112, a switch-mode power amplifier sub-system (PA) 110 and a reconstruction low-pass filter sub-system (LPF) 114 for demodulation.

In some embodiments, the input-signal 102 is a complex-valued baseband-signal denoted with Z(t) that is fed into the vector modulating linear switch-mode amplifier system 100. The vector modulation sub-system 112 generates or produces a modulated output-signal denoted with b(t) which is binary in amplitude and continuous in time. In other words, the vector modulation sub-system 112 generates the digital input-signal 104 for the switch-mode (power) amplifier sub-system 110. The digital input-signal 104 is amplified by the switch-mode (power) amplifier sub-system 110 and demodulated by the reconstruction low-pass filter sub-system 114. Note that in the Figs., real-valued signals are indicated by a single line, whereas complex-valued signals are indicated by a double line. The complex-valued baseband-signal Z(t) 102 comprises two arbitrary signal components designated as inphase component I(t) and quadrature component Q(t), which both can be real-valued, magnitude bounded, continuous-time signals of bandwidth B. The cut off frequencies of the inphase component I(t) and quadrature component Q(t) are $f_{lim} = \pm B/2$. Their relation is mathematically given by the formula Z(t)=I(t)+j Q(t) where j is the imaginary unit.

At its output, the vector modulating linear switch-mode amplifier system 100 generates or produces the real-valued amplified bandpass-signal u(t) 116 according to the formula $$u(t) = \gamma_0 \{Z(t - \tau_0)\exp[j2\pi f_c(t - \tau_0) - j\varphi_0]\} \quad (1)$$
$$= \gamma_0\{I(t - \tau_0)\cos[2\pi f_c(t - \tau_0) - \varphi_0] - Q(t - \tau_0) - \varphi_0]\}$$

where $\gamma_0$ is the amplifier gain, $f_c$ the desired carrier frequency, $\tau_0$ the time delay parameter and $\phi_0$ the phase shift parameter. The amplified output-signal 116 of the vector modulating linear switch-mode amplifier system 100 does not contain inband distortions, i.e. all system parameters (the amplifier gain $\gamma_0$, the desired carrier frequency $f_c$, the time delay parameter $\tau_0$ and the phase shift parameter $\phi_0$) are adjustable or system inherent but time-invariant. The time delay parameter $\tau_0$ is determined by the characteristics of the system components within the vector modulating linear switch-mode amplifier system 100. The value of the time delay parameter $\tau_0$ is not essential for the principle of operation of the vector modulating linear switch-mode amplifier system 100 and will be omitted ($\tau_0$=0) in the following description without loss of generality.

As the first stage of the vector modulating linear switch-mode amplifier system 100, the vector modulation sub-system 112 is fed by the complex-valued input-signal Z(t) 102 and generates the real-valued binary continuous-time signal (or digital input-signal 104 for the switch-mode (power) amplifier sub-system 110) at its output. This output-signal 104 possesses out-of-band spectral components but no inband signal disturbances within the frequency spectrum of the desired amplified output-signal u(t) 116. In other words, distortions are located at a frequency higher than the predefined frequency band. The output-signal 104 of the vector modulation sub-system 112 feeds the switch-mode (power) amplifier 110, which implicates the gain parameter $\gamma_0$ of the vector modulating linear switch-mode amplifier system 100. The switch-mode (power) amplifier sub-system 110 is able to amplify binary continuous-time signals without distortions and shall be designed for maximum efficiency. The reconstruction low-pass filter sub-system 114 with the cut-off frequency $f_a$ is the last stage of the vector modulating linear switch-mode amplifier system 100. It acts as a demodulator by suppressing the undesired out-of-band spectral components of the amplified binary signal 106. In other words, the distortions are located at a frequency higher than the predefined frequency band. Thus, it reconstructs the amplified bandpass-signal u(t) 116, which is the output-signal of the vector modulating linear switch-mode amplifier system 100. To maintain the high efficiency of the vector modulating linear switch-mode amplifier system 100, the low-pass filter sub-system 114 shall be designed for small power losses. Since the switch-mode (power) amplifier sub-system 110 and reconstruction low-pass filter sub-system 114 strongly interact, both sub-systems 110 and 114 have to be optimized jointly.

In other words, in some embodiments, the input-signal 102 of the vector modulating linear switch-mode amplifier system 100 is a band limited complex-valued baseband signal. The baseband signal (input-signal 102) is frequency shifted to the desired carrier frequency and used for pulse modulation in an integrated process. An intermediate binary signal (or digital input-signal 104) which is generated or produced by the modulator unit (or vector modulation sub-system 112), is amplified by the switch-mode element (or switch-mode (power) amplifier sub-system 110) and demodulated by the reconstruction low-pass filter 114. The vector modulating linear switch-mode amplifier system 100 generates the amplified bandpass RF signal 116 (RF=radio frequency) around the carrier frequency $f_c$ at its output.

In comparison to the techniques, which increase efficiency for in the power-back-off region or which increase linearity for the low power-back-off region, the switch-mode amplification is expected to achieve higher efficiency improvements even for signals with a high peak-to-average-power ratio. The switch-mode amplification scheme according to the concept of the present invention has some fundamental advantages compared to the conventional pulse-width modulation and sigma-delta modulation schemes. First, the vector modulating linear switch-mode amplifier system 100 does not produce inband signal distortions (within the predefined frequency band). Furthermore it uses a feed-forward structure and is therefore stable, even at very high operational frequencies. Because the switching frequencies are comparatively low, there is no need for oversampling to increase the quality of the output-signal 116. Finally, the vector modulating linear switch-mode amplifier system 100 provides an inherent frequency conversion.

Figure 3:
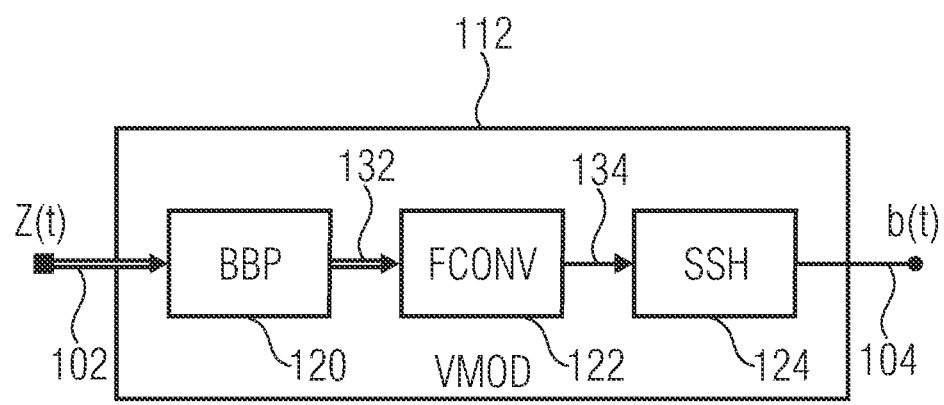
FIG. 3 shows a block diagram of an embodiment of the vector modulation sub-system shown in FIG. 2.

FIG. 3 shows a block diagram of an embodiment of the vector modulation sub-system 112 shown in FIG. 2. In other words, FIG. 2 illustrates a schematic block diagram of the vector modulation sub-system 112, which is the first stage of the vector modulating linear switch-mode amplifier system 100. The vector modulation sub-system 112 takes the complex-valued input-signal Z(t) 102 and generates or produces the binary continuous-time output-signal b(t) 104. The vector modulation sub-system 112 comprises a baseband processor (BBP) 120, a frequency converter (FCONV) 122 and a signal shaper (SSH) 124.

Figure 4A:
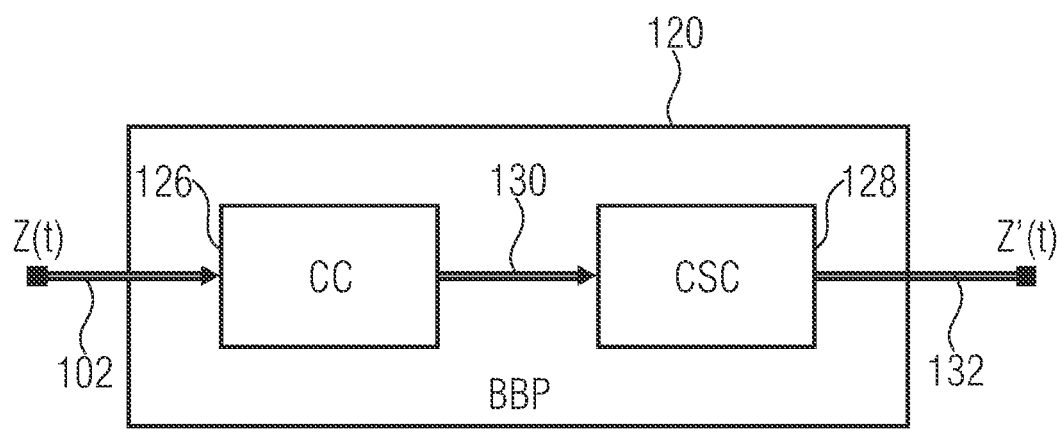
FIG. 4a shows a block diagram of an embodiment of the baseband processor shown in FIG. 3.

FIG. 4a shows a block diagram of an embodiment of the baseband processor 120 shown in FIG. 3. The baseband processor 120 comprises a complex conjugation block (CC) 126 and a complex scaling block (CSC) 128. The input-signal Z(t) 102 of the vector modulation sub-system 112 is fed into the baseband processor 120. The baseband processor 120 may perform two complex operations. A complex conjugation and a complex scaling. The complex conjugation block 126 generates or produces at its output the complex conjugate 130 of the input-signal Z(t) 102. The output-signal 130 of the complex conjugation block 126 is fed into the complex scaling block 128, where it is multiplied by an arbitrary but time invariant complex-valued constant with the polar radius ρ and polar angle φ. The parameter φ relates directly to the phase shift of the bandpass-output-signal u(t) 116 according to equation (1) and is given by the formula $\phi=\phi_0-\pi/2$. The constant ρ influences the magnitude bound of Z(t) 102 as described later. The output-signal 132 of the baseband processor 120 is the complex-valued modified baseband-signal 132 designated with Z'(t). The bandwidth of the output-signal Z'(t) 132 of the baseband processor 120 is the same as the bandwidth of the input-signal Z(t) 102. Referred to the frequency spectrum of the input-signal 102, the frequency spectrum of the output-signal 132 of the baseband processor 120 is scaled in magnitude and phase and its frequency axis is reversed.

Figure 4B:
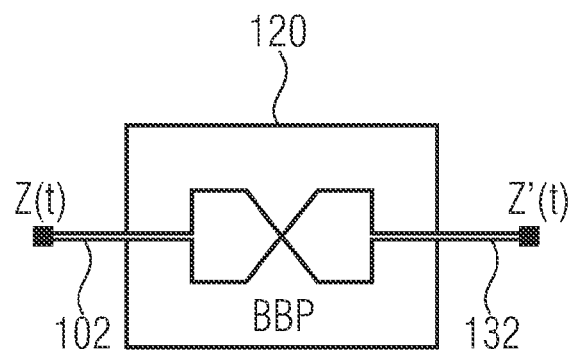
FIG. 4b shows a block diagram of an alternative embodiment of the baseband processor shown in FIG. 3.

FIG. 4b shows a block diagram of an alternative embodiment of the baseband processor shown in FIG. 3. In the special case ρ=1 and φ=-π/2, i.e. $\phi_0=0$, the baseband processor 120 simply might be designed as interchanging the components I(t) and Q(t) of the input-signal Z(t) 102 to generate the output-signal Z'(t) 132. In this case, the amplified bandpass-output-signal 116 of the vector modulating linear switch-mode amplifier system 100 becomes $$u(t)=\gamma_0[I(t)\cos(2\pi f_c t)-Q(t)\sin(2\pi f_c t)]. \tag{2}$$

FIG. 5 shows a block diagram of an embodiment of the frequency converter 122 shown in FIG. 3. Within the vector modulation sub-system 112, the baseband processor 120 is followed by the frequency converter 122. The frequency converter 122 converts the complex-valued modified baseband-input-signal Z'(t) 132 to the real-valued bandpass output-signal x(t) 134 at the intermediate mixing center frequency $f_m$. The frequency converter 122 comprises two frequency mixers realized by a first multiplier (M1) 136 and a second multiplier (M2) 138, a signal combiner realized by a subtractor (SUB) 140 and a first oscillator (OSC1) 142 which generates two continuous wave signals of the intermediate frequency $f_m$. The signal 144 at the output c of the first oscillator 142 has the form $c_1(t)=\cos(2\pi f_m t)$ and the signal 146 at the output of the first oscillator 142 has the form $s_1(t)=\sin(2\pi f_m t)$.

The real part (signal 148) of the frequency converter input-signal Z'(t) 132 is mixed with the oscillator signal $c_1(t)$ 144 in the multiplier 136, while the imaginary part (signal 150) of the frequency converter input-signal Z'(t) 132 is mixed with the oscillator signal $s_1(t)$ 146 in the multiplier 138. The output-signal 152 of the first multiplier 136 is fed to the positive input (+), and the output-signal 154 of the second multiplier 138 is fed to the negative input (−) of the subtractor 140. In the subtractor 140, these signals 152 and 154 are combined to the real-valued bandpass-signal x(t) 134, which is the output-signal of the frequency converter 122.

It is noted that the oscillator signals $c_1(t)$ 144 and $s_1(t)$ 146 have the same intermediate mixing center frequency $f_m$ and a 90 degree phase difference. Technically, those signals 144 and 146 can be generated in different ways as described later in FIG. 8.

Figure 6:
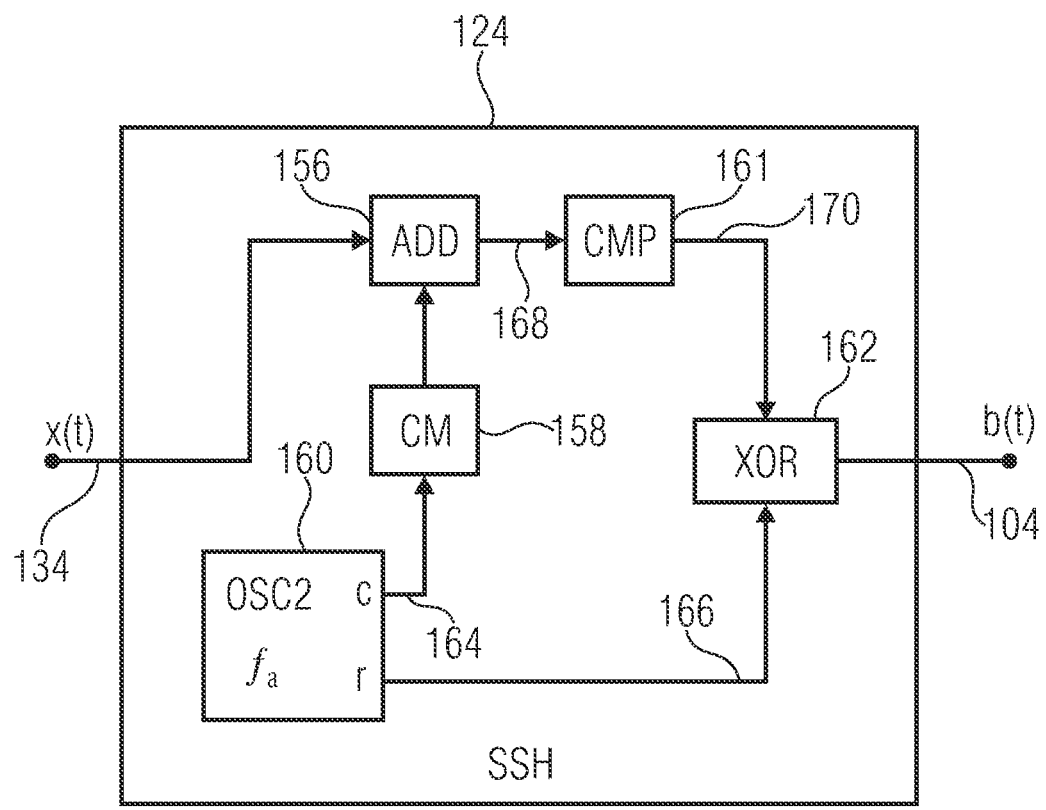
FIG. 6 shows a block diagram of an embodiment of the signal shaper shown in FIG. 3.

FIG. 6 shows a block diagram of an embodiment of the signal shaper 124 shown in FIG. 3. The signal shaper 124 is the last stage of the vector modulation sub-system 112. It converts the real-valued bandpass-input-signal x(t) 134 to the real-valued binary continuous-time output-signal b(t) 104, or in other words, to the digital input-signal 104 for the switch-mode (power) amplifier sub-system 110. The signal shaper 122 comprises a signal adder (ADD), a constant multiplier (CM) 158, a second oscillator (OSC2) 160, a signal comparator (CMP) 161, and a logical exclusive-or element (XOR) 162.

The constant multiplier 158 multiplies its input-signal 164 with the real-valued positive constant α. Together with the polar radius constant ρ of the baseband processor 120, the constant α determines the magnitude bound of the input-signal 102 of the vector modulating linear switch-mode amplifier system 100 according to the inequality:

$$|Z(t)| < \frac{\alpha}{\rho}, \quad (3)$$
$$\forall t \in \mathbb{R}.$$

The second oscillator 160 generates two auxiliary signals of the frequency $f_a$ at its outputs c and r. The signal 164 at the output c of the second oscillator 160 has the form $c_2(t)=\cos(2\pi f_a t)$ and the signal 166 at the output r of the second oscillator 160 has the form:

$$r_2(t) = \sum_{n=-\infty}^{\infty} (-1)^n \operatorname{rect}\left(\frac{t}{T} - \frac{1}{2} - n\right), \quad (4)$$
$$T = \frac{1}{2f_a},$$

where the rect function is defined by the formula:

$$\operatorname{rect}(t) = \begin{cases} 1, & |t| \le 1/2 \\ 0, & \text{else}. \end{cases} \quad (5)$$

The oscillator signal $r_2(t)$ 166 is a binary continuous-time signal with two logical levels ("high" and "low"). The logical "high" level may be defined as the signal value 1 and the logical "low" level may be defined as the signal value −1. Naturally, in some embodiments, other definitions might be applied.

The comparator 161 converts its input-signal 168 into a binary continuous-time output-signal 170. The output-signal 170 of the comparator 161 comprises a logical "high" level if the input-signal 168 of the comparator 161 is larger than zero. Otherwise, the output-signal 170 of the comparator 161 comprises a logical "low" level.

The exclusive-or element 162 generates or produces the logical exclusive-or connection of two binary input-signals 166 and 170. The output-signal 104 of the exclusive-or element 162 comprises a logical "low" level if both input-signals of the exclusive-or element 162 have equal logical levels. Otherwise, the output-signal 104 of the exclusive-or element 162 comprises a logical "high" level.

The output-signal 104 of the signal shaper 124 is generated or produced as follows. The bandpass-input-signal x(t) 134 of the signal shaper 124 is fed into the first input of the adder 156. The second oscillator signal $c_2(t)$ 164 is scaled by the multiplier 158, before it is fed into the second input of the adder 156 and added to the bandpass-signal x(t) 134. The comparator 161 converts the output-signal 168 of the adder 156 into a binary continuous-time signal 170. The exclusive-or element 162 is fed by the binary output-signal 170 of the comparator 161 and the signal 166 of the output r of the second oscillator 160. The exclusive-or element 162 generates the binary continuous-time signal b(t) 104, which is also the output-signal of the vector modulation sub-system 112, or in other words, the digital input-signal 104 for the switch-mode (power) amplifier sub-system 110.

It has to be noted that the signals $c_2(t)$ 164 and $r_2(t)$ 166 of the second oscillator 160 can be generated in different ways. For example, the sinusoidal wave signal $c_2(t)$ 164 may be generated directly by the second oscillator 160, while the rectangular wave signal $r_2(t)$ 166 may be generated or produced from the signal $c_2(t)$ 164 by phase shifting and binarization as described later in FIG. 8.

Figure 7A:
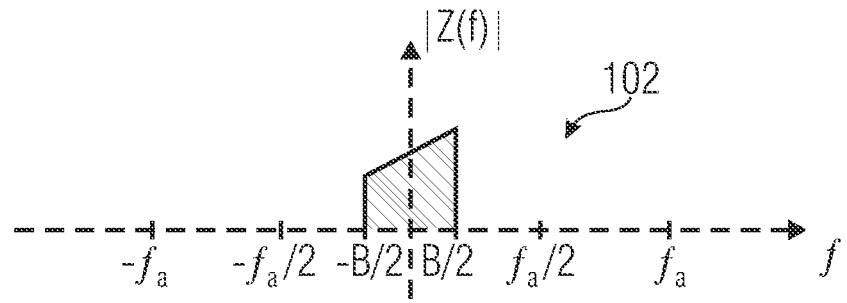
FIG. 7a shows a diagram of an exemplary magnitude signal spectrum of the vector modulating linear switch-mode amplifier shown in FIG. 2.
Figure 7B:
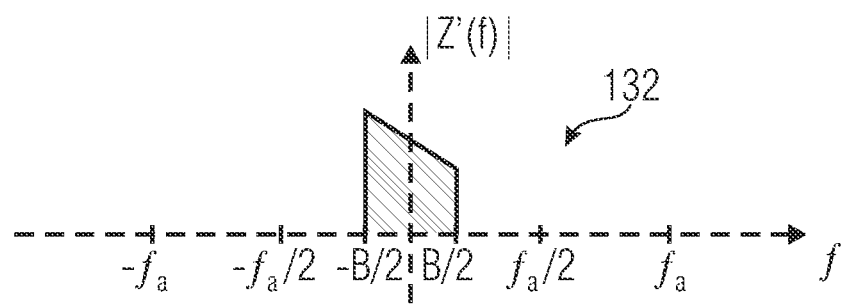
FIG. 7b shows a diagram of an exemplary magnitude spectrum of the output-signal of the baseband processors shown in FIG. 4a or 4b.
Figure 7C:
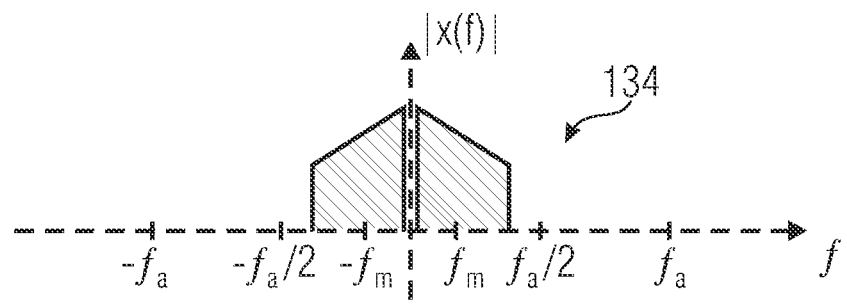
FIG. 7c shows a diagram of an exemplary magnitude spectrum of the output-signal of the frequency converter shown in FIG. 5.
Figure 7D:
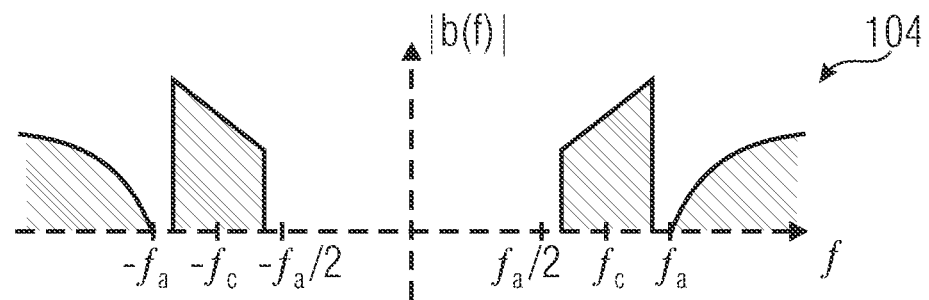
FIG. 7d shows a diagram of an exemplary magnitude spectrum of the output-signal of the signal shaper shown in FIG. 6.
Figure 7E:
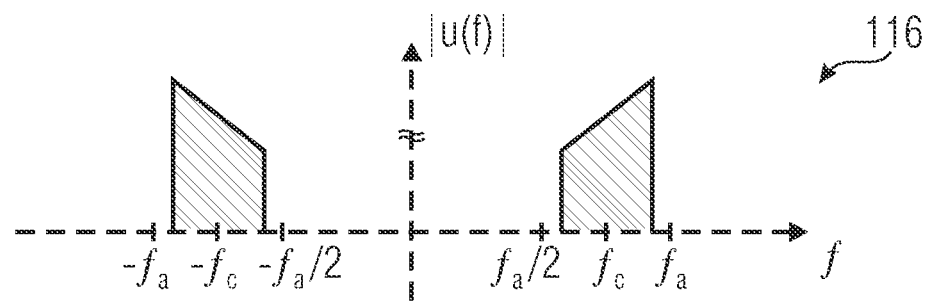
FIG. 7e shows a diagram of an exemplary magnitude spectrum of the output-signal of the vector modulating linear switch-mode amplifier shown in FIG. 2.

FIGS. 7a to 7e show the frequency characteristics of the vector modulating linear switch-mode amplifier system 100. Thereby, the ordinate describes the magnitude and the abscissa describes the frequency. The magnitude spectrum of an exemplary input-signal Z(t) 102 is shown in FIG. 7a. The baseband processor 120 generates the complex-valued modified baseband-output-signal Z'(t) 132 whose magnitude spectrum is shown in FIG. 7b. In this case, the parameter ρ was exemplarily chosen to be 4/3. The magnitude spectrum of the real-valued bandpass-signal x(t) 134 which is generated or produced by the frequency converter 122 is illustrated in FIG. 7c. The binary continuous-time signal b(t) (or digital input-signal 104) produced by the signal shaper 124, whose magnitude spectrum is illustrated in FIG. 7d, is also the output-signal of the vector modulation sub-system 112. It comprises the desired inband (within the predefined frequency band) spectral components and undesired out-of-band spectral components (distortions located at a frequency higher than the predefined frequency band), which are suppressed by the reconstruction low-pass filter sub-system 114. The magnitude spectrum of the desired amplified bandpass-output-signal u(t) 116 of the vector modulating linear switch-mode amplifier system 100 is illustrated in FIG. 7e. The lowest frequency of the undesired spectral components is equal to the auxiliary frequency $f_a$ of the second oscillator 160 of the signal shaper 124. The stop band of the reconstruction low-pass filter sub-system 114 has to cover all frequencies from $f_a$ to infinity.

The auxiliary frequency $f_a$ relates to the carrier frequency $f_c$ and to the mixing frequency $f_m$ according to the equality $$f_a = f_c + f_m. \quad (6)$$

Furthermore, there are bounds of the carrier frequency $f_c$ given by the formula $$\frac{f_a}{2} + \frac{B}{2} < f_c < f_a - \frac{B}{2}, \quad (7)$$

and bounds of the mixing frequency $f_m$ given by the formula $$\frac{B}{2} < f_m < \frac{f_a}{2} - \frac{B}{2}. \quad (8)$$

The inequalities (7) and (8) also imply the lower bound of the auxiliary frequency $f_a$ according to the inequality $$f_a > 2B. \quad (9)$$

The lower and upper bounds of the carrier frequency $f_c$ converge to $3f_a/4$, and the lower and upper bounds of the mixing frequency $f_m$ converge to $f_a/4$, when the auxiliary frequency $f_a$ tends towards its bound 2B. This means that in the special case $f_c=3f_a/4$ and $f_m=f_a/4$, the auxiliary frequency $f_a$ can be chosen as low as possible, according to the condition (9) for the given bandwidth B of the input-signal Z(t) 102.

Embodiments of the vector modulating linear switch-mode amplifier system 100 described above relate to analog signals which might be continuous in time and amplitude. Thereby, the system components between the baseband-signal inputs and the signal comparator elements may operate in the analog signal domain.

In the following, embodiments of the vector modulating linear switch-mode amplifier system 100 realized partly with digital signal processing components are described. Thereby, the input-signal 102 of the vector modulating linear switch-mode amplifier system 100 might be a complex-valued digital signal sequence Z(n) which has been generated e.g. by a digital signal generator or has been sampled in the analog signal domain.

Moreover, the following embodiments of the vector modulating linear switch-mode amplifier system 100 may use the same switch-mode (power) amplifier sub-system 110 and reconstruction low-pass filter sub-system 114 as described in the above embodiments. In other words, the following embodiments of the vector modulating linear switch-mode amplifier system 100 vary in the vector modulation sub-system 112.

Digital domain components may operate with the sampling rate $f_s$ which may correspond to the sampling time interval $T_s = 1/f_s$. Due to the quantization of the amplitude in the digital signal domain, there can be inband distortions at the desired analog output-signal u(t) of the vector modulating linear switch-mode amplifier system 100, in other words, within the predefined frequency band. The quantization noise (or distortions) can be easily reduced by using a larger quantization resolution according to some embodiments of the present invention.

Figure 8:
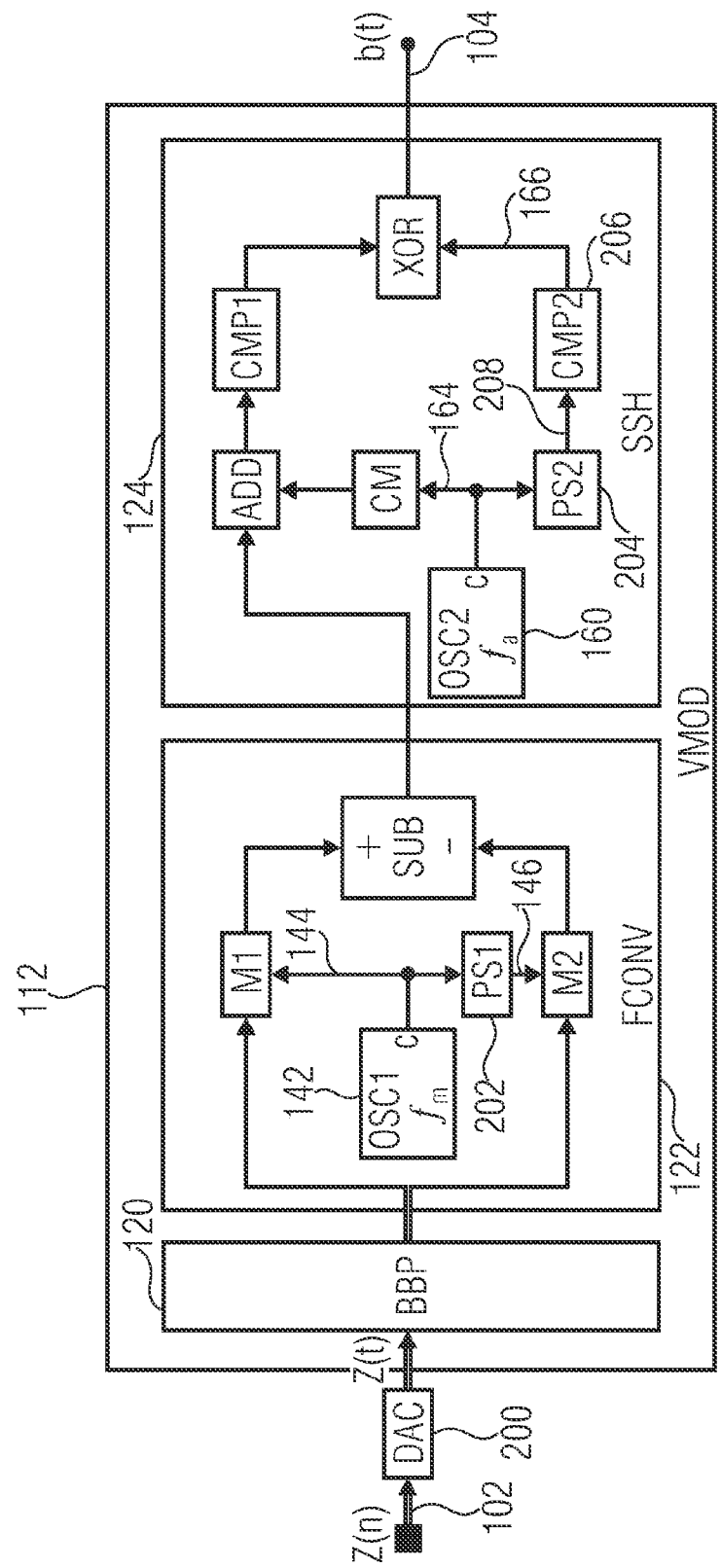
FIG. 8 shows a block diagram of an embodiment of a fully analog vector modulation sub-system.

FIG. 8 shows a block diagram of an embodiment of a fully analog vector modulation sub-system 112. The fully analog vector modulation sub-system 112 comprises a baseband processor 120, a frequency converter 122, a signal shaper 124 and a complex digital-to-analog converter (DAC) 200. The transition from the digital to the analog signal domain is made in front of the vector modulating linear switch-mode amplifier system 100. The digital signal sequence Z(n) (or input-signal 102) is converted to the analog signal Z(t) by a complex digital-to-analog converter 200 in combination with low-pass filters for inphase and quadrature signal reconstruction. These system components are included in the complex digital-to-analog converter 200. The signal Z(t) is fed into the vector modulation sub-system 112, where the binary continuous-time output-signal b(t) (or digital input-signal 104 for the switch-mode (power) amplifier sub-system 110) is generated. For the given sampling rate $f_s$, the stop band of the complex digital-to-analog converter 200 reconstruction low-pass filters begins at $f_s/2$ and the bandwidth of the complex-valued analog signal Z(t) is smaller than or equal to $f_s$.

As noted in the above embodiments, the auxiliary wave signals used in the frequency converter 122 and in the signal shaper 124 can be generated in different ways. For example, in the frequency converter 122 shown in FIG. 8, only the sinusoidal wave signal $c_1(t)$ 144 is directly generated by the first oscillator 142, while the wave signal $s_1(t)$ 146 is produced by 90 degree phase shifting of $c_1(t)$ 144, realized by a first phase shift element (PS1) 202. Accordingly, in the signal shaper 124, only the sinusoidal wave signal $c_2(t)$ 164 is directly generated by the second oscillator 160, while the rectangular wave signal $r_2(t)$ 166 is generated or produced by a 90 degree second phase shift element (PS2) 204 and the second signal comparator 206. The output-signal 208 of the second phase shift element 204 has the form $s_2(t) = \sin(2\pi f_a t)$, which is then converted to the rectangular wave signal $r_2(t)$ 166 by the second comparator 206.

Figure 9:
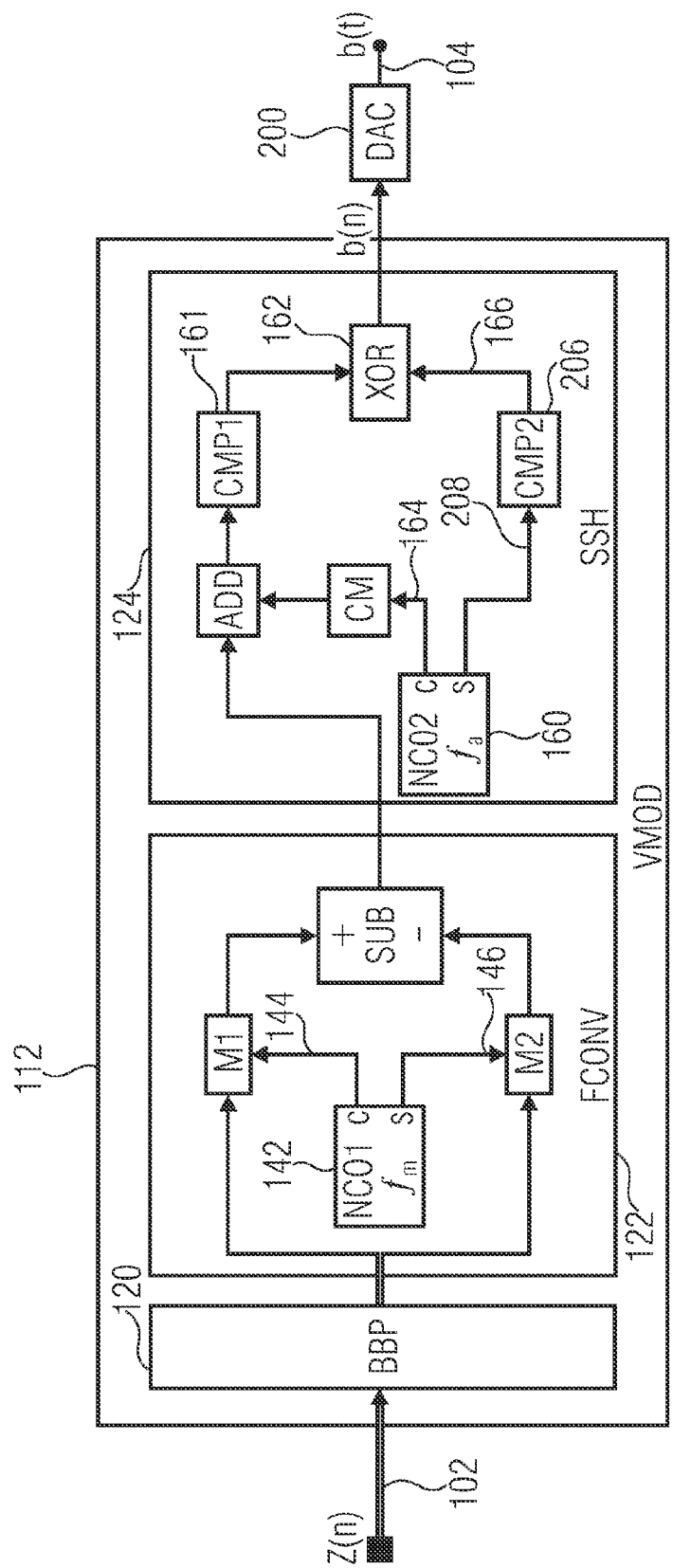
FIG. 9 shows a block diagram of an embodiment of a fully digital vector modulation sub-system.

FIG. 9 shows a block diagram of an embodiment of a fully digital vector modulation sub-system 112. The fully digital vector modulation sub-system 112 comprises a baseband processor 120, a frequency converter 122, a signal shaper 124 and a single bit digital-to-analog converter (DAC) 200. The digital signal sequence Z(n) (or input-signal 102) is fed directly into the vector modulation sub-system 112 and the binary signal sequence b(n) is generated. The continuous-time output-signal b(t) (or digital input-signal 104 for the switch-mode (power) amplifier sub-system 110) is produced by a single bit digital-to-analog converter (DAC) 200 according to the formula $$b(t) = \sum_{n=-\infty}^{\infty} b(n) \operatorname{rect}\left(\frac{t}{T_s} - n\right), \quad (10)$$

$$T_s = \frac{1}{f_s}.$$

The vector modulation sub-system 112 and its blocks can be designed as digital devices with the same functional behavior as in the analog design, as described above in FIGS. 3 to 6. The difference is that all system components operate on signals which are discrete in time and amplitude.

In the frequency converter 122, a first numerically-controlled oscillator (NCO1) 142, instead of the first analog oscillator 142, generates the sinusoidal wave signal sequences $c_1(n)$ 144 and $s_1(n)$ 146. In the signal shaper 124, the second numerically-controlled oscillator (NCO2) 160, instead of the second analog oscillator 160, generates the auxiliary signal sequences $c_2(n)$ 164 and $s_2(n)$ 208. The second signal comparator 206 is used to convert the sinusoidal wave signal sequence $s_2(n)$ 208 to the rectangular wave signal sequence $r_2(n)$ 166.

Actually, in the embodiment of the vector modulation sub-system 112 shown in FIG. 9, the two signal comparators 161 and 206 and the logical exclusive-or element 162 generate or produce binary discrete-time output-signals. Because of the finite time domain resolution of these binary discrete-time signals, zero crossings of the binary continuous-time output-signal b(t) 104 of the vector modulation sub-system 112 are distorted by time quantization. The quantization error $\Delta t_q$ of each zero crossing event is in the interval $-1/(2f_s) \leq \Delta t_q < 1/(2f_s)$. This also produces additional inband (within the predefined frequency band) distortions at the desired analog output-signal u(t) 116 of the vector modulating linear switch-mode amplifier system 100. Distortions according to the time domain quantization may be reduced by using a larger sampling rate $f_s$, which increases demands on the vector modulating linear switch-mode amplifier system 100.

Figure 10:
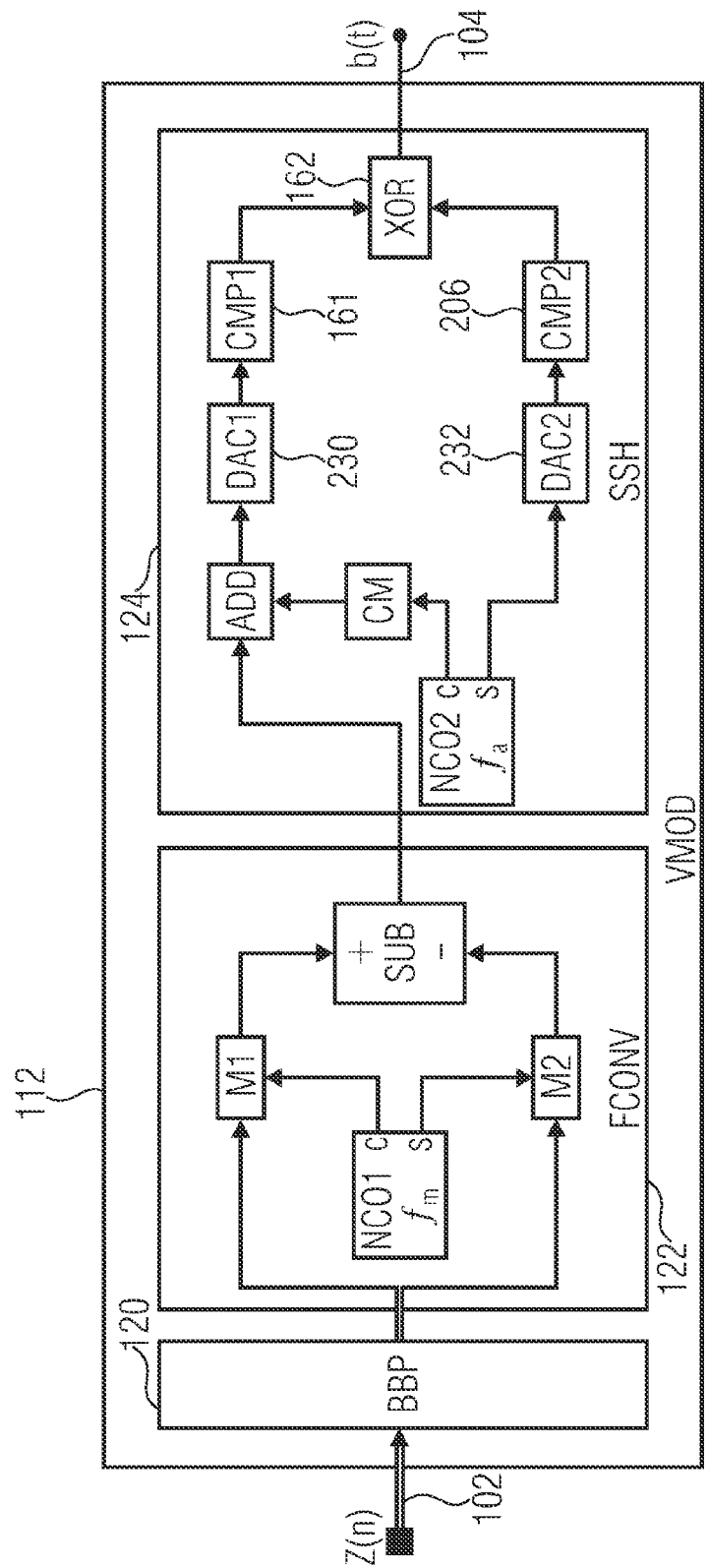
FIG. 10 shows a block diagram of an embodiment of a mixed signal vector modulation sub-system.

FIG. 10 shows a block diagram of an embodiment of a mixed signal vector modulation sub-system 112. The mixed signal vector modulation sub-system 112 comprises a baseband processor 120, a frequency converter 122 and a signal shaper 124. In FIG. 10, the transition from the digital domain to the analog domain is realized within the vector modulation sub-system 112 of the vector modulating linear switch-mode amplifier system 100. The digital signal sequence Z(n) 102 is fed into the vector modulation sub-system 112 and the binary continuous-time output-signal b(t) 104 is generated. The vector modulation sub-system 112 comprises partly digital and partly analog components. Digital-to-analog converters in connection with reconstruction low-pass filters are used within the vector modulation sub-system 112, and can in principle be located at different positions. To avoid signal distortion from time domain quantization, as already described in the above embodiments, the first signal comparator 161, the second signal comparator 206 and the logical exclusive-or element 162 may operate in the continuous-time signal domain. Moreover, it is technically advantageous to realize the vector modulation sub-system 112 with as many digital devices as possible because of technological benefits.

In FIG. 10, a first digital-to-analog converter comprising a low-pass filter (DAC1) 230 is located in front of the first signal comparator 161 and a second digital-to-analog converter comprising a low-pass filter (DAC2) 232 is located in front of the second comparator 206. In this case, the sampling rate $f_s$ may be chosen at least equal to $2f_a$ for reconstruction of the desired output-signal u(t) 116 of the vector modulating linear switch-mode amplifier system 100 without distortion according to the time domain quantization. The digital system components are realized in the same way as in the fully digital system design. All system components which are post-connected to the first digital-to-analog converter 230 and the second digital-to-analog converter 232 can be realized as described in FIGS. 2 to 6.

Figure 11:
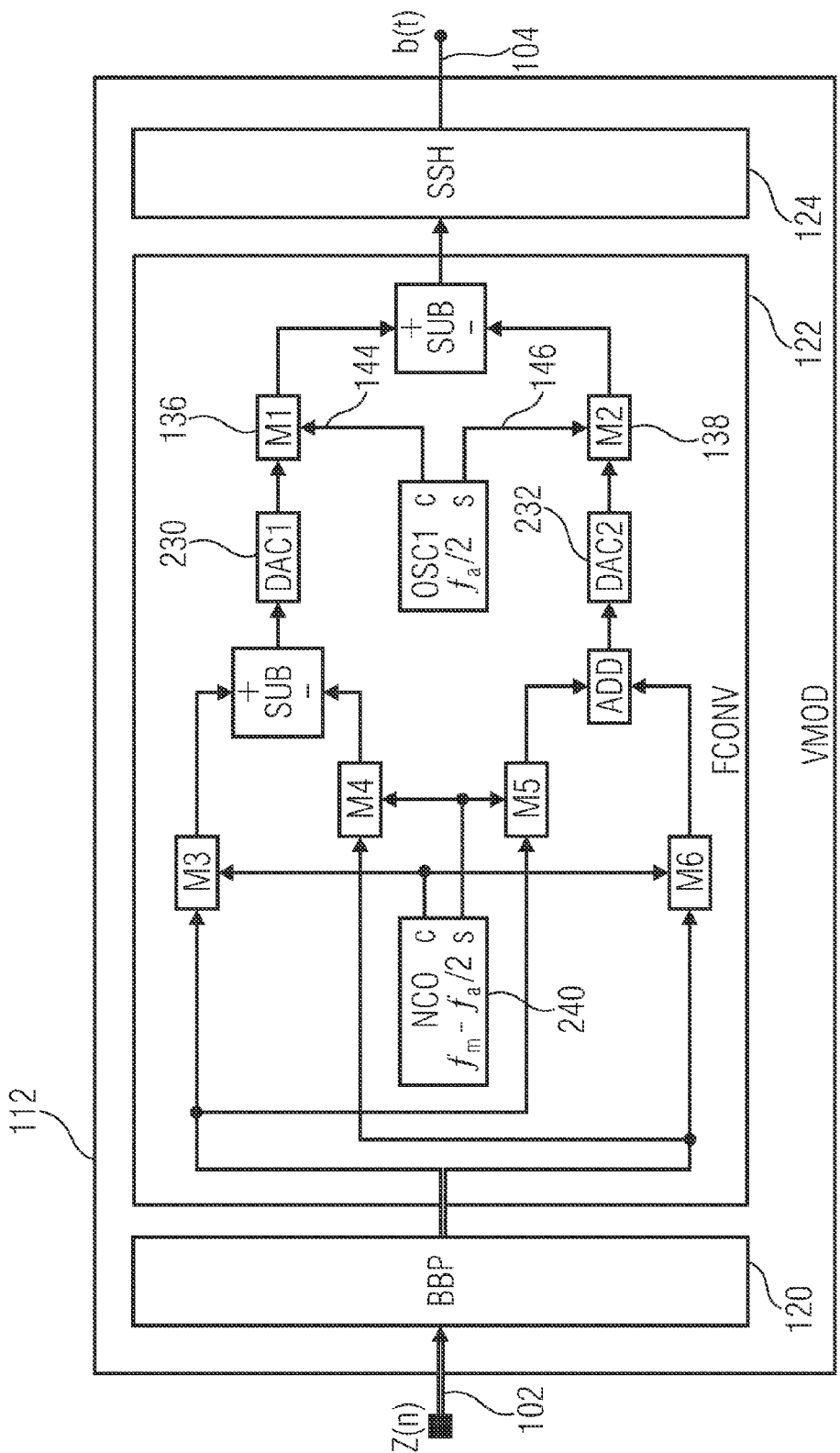
FIG. 11 shows a block diagram of an alternative embodiment of a mixed signal vector modulation sub-system.

FIG. 11 shows a block diagram of an alternative embodiment of a mixed signal vector modulation sub-system 112. The mixed signal vector modulation sub-system 112 comprises a baseband processor 120, a frequency converter 122 and a signal shaper 124. The mixed signal vector modulation sub-system 112 shown in FIG. 11 may have many advantages with regard to the technical realization. In FIG. 11, the signal shaper 124 is not shown in detail, but may be identical to the fully analog signal shaper 124 shown in FIG. 8.

In contrast to the fully digital vector modulation sub-system 112 shown in FIG. 9 or to the mixed signal vector modulation sub-system 112 shown in FIG. 10, the digital-to-analog converters 230 and 232 are driven with low-frequency signals with a maximum frequency of bandwidth B. Compared to the fully analog vector modulation sub-system 112 shown in FIG. 8, the two coherent analog oscillators 142 and 160 have a fixed frequency ratio of ½ which can easily be generated, using an oscillator and a frequency divider. Moreover, such a frequency divider inherently generates the signals c 144 and s 146 needed to drive the two multipliers 136 and 138. On the downside, the concept shown in FIG. 11 needs an additional numerically-controlled oscillator 240 in the digital domain. Further design variation for digital input signals may be given by shifting the transition point from the digital to the analog domain.

Further embodiments of the present invention provide an amplifier concept, which is capable of amplifying bandpass-signals with increased power efficiency and high linearity. Moreover, the amplifier concept is directly combined with the frequency converter to achieve a simplified system setup. In other words, embodiments of the present invention provide a combination of frequency conversion and switch-mode amplification in one integrated modulation process.

In some embodiments, the vector modulating linear switch-mode amplifier system 100 combines the functionalities of a vector modulator for direct frequency conversion and a linear switch-mode (power) amplifier.

Embodiments of the present invention provide a modulation scheme, which enables error-free, linear amplification after the switch-mode amplifier and demodulator. The scheme can be used for all kinds of bandpass-signals up to a relative bandwidth of 50%, which holds for all practical wireless communication signals except for some ultra wide band (UWB) signals. The modulator inherently establishes a frequency conversion from baseband- to bandpass-domain.

Further embodiments of the present invention provide a method for amplifying an input-signal. The method comprises amplifying a digital input-signal with a switch-mode amplifier. Moreover, the method is characterized in that the digital input-signal is generated based on the input-signal such that the digital input-signal is located at a predefined frequency band and such that distortions are located at a frequency higher than the predefined frequency band.

Embodiments of the present invention may be implemented in wireless communication systems, where bandpass-signal amplification combined with frequency conversion is used.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises a system configured to electronically or optically transfer a computer program for performing one of the methods described herein to a receiver. The receiver may, for example, be a computer, a memory device or the like. The system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Apparatus for amplifying an input-signal, the apparatus comprising:
   a switch-mode amplifier for amplifying a binary input-signal;
   a generator for generating the binary input-signal based on the input-signal;
   wherein the generator comprises a signal shaper configured to generate a binary continuous-time signal on the basis of the input-signal and a carrier signal, and to logically combine the binary continuous-time signal and a rectangular wave signal thereby generating the binary input-signal at a predefined frequency band, wherein distortions effected during generating the binary input-signal have a lowest frequency which is higher than the predefined frequency band.

2. Apparatus according to claim 1, wherein the generator is configured to shift the input-signal from a baseband or a predefined intermediate frequency band to the predefined frequency band.

3. Apparatus according to claim 1, wherein the generator is configured to digitize the input-signal to acquire the binary input-signal.

4. Apparatus according to claim 2, wherein the input-signal is complex-valued, and wherein the generator is configured to convert the complex-valued input-signal into the input-signal located at the predefined intermediate frequency band.

5. Apparatus according to claim 4, wherein the generator is configured to perform a complex scaling of the complex-valued input-signal.

6. Apparatus according to claim 4, wherein the generator is configured to perform a complex conjugation of the complex-valued input-signal.

7. Apparatus according to claim 1, comprising a low-pass filter for low-pass filtering the amplified binary input-signal, such that the distortions located at the frequency higher than the predefined frequency band are reduced.

8. Method for amplifying an input-signal, the method comprising:
   amplifying a binary input-signal with a switch-mode amplifier;
   wherein the binary input-signal is generated based on the input-signal;
   wherein generating the binary input-signal comprises generating a binary continuous-time signal on the basis of the input-signal and a carrier signal, and to logically combine the binary continuous-time signal and a rectangular wave signal thereby generating the binary input-signal at a predefined frequency band, wherein distortions effected during generating the binary input-signal have a lowest frequency which is higher than the predefined frequency band.

9. Method according to claim 8, wherein the step of generating the binary input-signal comprises shifting the input-signal from a baseband or a predefined intermediate frequency band to the predefined frequency band.

10. Method according to claim 8, wherein the step of generating the binary input-signal comprises digitizing the input-signal to acquire the binary input-signal.

11. Method according to claim 9, wherein the input-signal is complex-valued, and wherein the step of generating the binary input-signal comprises converting the complex-valued input-signal into the input-signal located at the predefined intermediate frequency.

12. Method according to claim 11, wherein the step of generating the binary input-signal comprises complex scaling the complex-valued input-signal.

13. Method according to claim 11, wherein the step of generating the binary input-signal comprises complex conjugation of the complex-valued input-signal.

14. Method according to claim 8, comprising low-pass filtering a amplified binary input-signal, such that distortions located at the frequency higher than the predefined frequency band are reduced.

15. A non-transitory computer readable medium including a computer program comprising a program code for performing, when running on a computer or microprocessor, a method according to claim 8.

* * * * *

UNITED STATES PATENT AND TRADEMARK OFFICE
CERTIFICATE OF CORRECTION

PATENT NO. : 8,803,608 B2
APPLICATION NO. : 14/022644
DATED : August 12, 2014
INVENTOR(S) : Hung-Anh Nguyen et al.

It is certified that error appears in the above-identified patent and that said Letters Patent is hereby corrected as shown below:

On the Title Page

The following should be corrected for the Applicant in Item (71):

"Fraunhofer-Gesellschaft zur Foerderung der angewandten Forschung e.V."

Signed and Sealed this
Twenty-fourth Day of February, 2015

Michelle K. Lee
*Deputy Director of the United States Patent and Trademark Office*